United States Patent
Kim et al.

(10) Patent No.: US 8,545,631 B2
(45) Date of Patent: Oct. 1, 2013

(54) MASK DEVICE, METHOD OF FABRICATING THE SAME, AND METHOD OF FABRICATING ORGANIC LIGHT EMITTING DISPLAY DEVICE USING THE SAME

(75) Inventors: Eui-Gyu Kim, Suwon-Si (KR); Tac-Hyung Kim, Suwon-Si (KR); Wook Han, Suwon-Si (KR)

(73) Assignee: Samsung Display Co., Ltd., Yongin-si (KR)

( * ) Notice: Subject to any disclaimer, the term of this patent is extended or adjusted under 35 U.S.C. 154(b) by 119 days.

(21) Appl. No.: 11/964,289

(22) Filed: Dec. 26, 2007

(65) Prior Publication Data
US 2008/0157084 A1 Jul. 3, 2008

(30) Foreign Application Priority Data
Dec. 27, 2006 (KR) .................. 10-2006-0135494

(51) Int. Cl.
*C23C 16/00* (2006.01)
*H01L 21/31* (2006.01)
*H01L 21/469* (2006.01)

(52) U.S. Cl.
USPC ....... 118/721; 204/298.11; 438/758; 438/944

(58) Field of Classification Search
None
See application file for complete search history.

(56) References Cited

U.S. PATENT DOCUMENTS

| | | | | |
|---|---|---|---|---|
| 4,048,536 A | * | 9/1977 | Brown | 313/403 |
| 4,565,755 A | * | 1/1986 | Ohtake et al. | 430/5 |
| 5,326,663 A | | 7/1994 | Tanaka et al. | |
| 5,709,804 A | * | 1/1998 | Makita et al. | 216/12 |
| 6,620,554 B1 | | 9/2003 | Komatsu et al. | |
| 6,642,644 B2 | * | 11/2003 | Kim et al. | 313/402 |
| 6,858,086 B2 | * | 2/2005 | Kang | 118/720 |
| 7,291,975 B2 | * | 11/2007 | Yang et al. | 313/506 |
| 2002/0102754 A1 | * | 8/2002 | Fujimori et al. | 438/22 |
| 2004/0021410 A1 | * | 2/2004 | Stagnitto et al. | 313/407 |

(Continued)

FOREIGN PATENT DOCUMENTS

| CN | 1534383 A | 10/2004 |
|---|---|---|
| CN | 1779566 A | 5/2006 |

(Continued)

OTHER PUBLICATIONS

Kato et al, KR1997-020212, May 28, 1997, "Process for creating mask", Machine translation.*

(Continued)

*Primary Examiner* — Evan Pert
*Assistant Examiner* — Andres Munoz
(74) *Attorney, Agent, or Firm* — Christie, Parker & Hale, LLP

(57) ABSTRACT

A mask device, a method of fabricating the mask device with improved reliability, a method of manufacturing a large-sized division mask device by forming a striped aperture parallel to the roll direction, and a method of fabricating an organic light emitting display device (OLED) using the mask device. The mask device includes: at least one mask alignment mark formed on a mask; a blocking region formed on the mask and blocking a deposition material; and an aperture region formed on the mask and through which the deposition material passes, wherein the at least one mask alignment mark is formed outside the aperture region, the aperture region has a stripe pattern, and the roll direction of the mask substrate is parallel to the longitudinal direction of the stripe pattern.

11 Claims, 9 Drawing Sheets

(56) References Cited

U.S. PATENT DOCUMENTS

| | | | |
|---|---|---|---|
| 2004/0115342 A1* | 6/2004 | Shigemura | 427/143 |
| 2004/0202821 A1 | 10/2004 | Kim et al. | |
| 2005/0106986 A1 | 5/2005 | Cok et al. | |
| 2005/0115503 A1* | 6/2005 | Hagiwara et al. | 118/721 |
| 2005/0166842 A1* | 8/2005 | Sakamoto | 118/721 |
| 2005/0167395 A1* | 8/2005 | Lee et al. | 216/41 |
| 2005/0199580 A1* | 9/2005 | Yang et al. | 216/12 |
| 2005/0250228 A1* | 11/2005 | Ko | 438/21 |
| 2007/0207392 A1* | 9/2007 | Kobayashi | 430/5 |

FOREIGN PATENT DOCUMENTS

| | | |
|---|---|---|
| JP | 4-47648 | 2/1992 |
| JP | 2001-237073 | 8/2001 |
| JP | 2003-17255 | 1/2003 |
| JP | 2004-185890 | 7/2004 |
| JP | 2006-331973 | 12/2006 |
| KR | 2001-28569 | 4/2001 |
| KR | 2003-23202 | 3/2003 |
| KR | 2003-49964 | 6/2003 |

OTHER PUBLICATIONS

Machine Translation, JP 2004-185890 A, Jul. 2004.*
Korean Notice of Allowability Issued Oct. 30, 2007.
Chinese Office Action, issued Jul. 24, 2009, in Chinese Patent Application No. 2007103013817.

* cited by examiner

MASK DEVICE, METHOD OF FABRICATING THE SAME, AND METHOD OF FABRICATING ORGANIC LIGHT EMITTING DISPLAY DEVICE USING THE SAME

CROSS-REFERENCE TO RELATED APPLICATIONS

This application claims the benefit of Korean Patent Application No. 2006-135494, filed Dec. 27, 2006, which is incorporated by reference for all purposes as if fully set forth herein.

BACKGROUND OF THE INVENTION

1. Field of the Invention

Aspects of the present invention relate to a mask device, a method of fabricating the mask device with improved reliability, a method of manufacturing a large-sized division mask device by forming a striped aperture parallel to the roll direction and a method of fabricating an organic light emitting display device (OLED) using the mask device.

2. Description of the Related Art

Recently, in order to solve problems with a conventional display device such as a cathode ray tube, people have been developing flat panel display devices such as liquid crystal display devices, organic light emitting display devices (OLEDs), plasma display panels, and so on.

In fabricating an OLED, an emission layer for emitting electrons to excite each of red (R), green (G) and blue (B) phosphors is formed using an evaporation method. The evaporation method is a method of inserting the raw material of the emission layer into a crucible in a vacuum chamber, and heating the crucible to evaporate the raw material to form a specific layer on a substrate. In this process, a mask is mounted in the vacuum chamber, and the raw material of the emission layer is evaporated in the pattern of the mask to form the emission layer having the designed patterns for R, G and B.

FIGS. 1A and 1B are plan views of a conventional mask device. Referring now to FIG. 1A, a conventional mask passes through a rolling process using a roller 1 formed of stainless steel or other metal materials to form a mask substrate 2. Then, using a photolithography method, the mask substrate 2 is etched to form an aperture region 3 and a blocking region 4, thereby completing the mask.

When the aperture region 3 and the blocking region 4 are formed after the rolling process on the mask substrate 2 using the photolithography method, the rolled direction of the mask substrate 2 is perpendicular to the stripe direction of the aperture region. However, as described above, in the case of the mask having a stripe pattern of the aperture region perpendicular to the rolled direction, it is difficult to adapt the mask to a large-sized substrate because of the limitation of the width of the mask substrate 2.

In addition, as shown in FIG. 1B, there is a variance in quality between the center area and the outer areas of the mask substrate 2, i.e., striped apertures are irregularly arranged, not aligned in a straight line. In FIG. 1A, the variance in quality is shown in the same direction as the rolled direction. In the conventional art, when the striped aperture region is formed using the photolithography method, the striped aperture region is formed close to the outer parts of the mask substrate, and is not formed in a straight direction because of the variance in quality between the center part and the outer parts of the rolled mask substrate 2. That is, because there is a small margin relative to the striped aperture region of the mask, it is difficult to obtain a reliable pattern during the subsequent patterning process using a mask. As a result, the reliability of the mask may be less than desired.

SUMMARY OF THE INVENTION

Aspects of the present invention provide a mask device, a method of fabricating the mask device with improved reliability, a method of manufacturing a large-sized division mask device by forming a striped aperture parallel to the roll direction, and a method of fabricating an organic light emitting display device (OLED) using the mask device.

According to an aspect of the present invention, a mask device includes: at least one mask alignment mark formed on a mask; a blocking region formed on the mask and blocking deposited material; and an aperture region formed on the mask and through which the deposited material passes, wherein at least one mask alignment mark is formed outside the aperture region, the aperture region has a stripe pattern, and the roll direction of the mask substrate is parallel to the longitudinal direction of the stripe pattern.

According to another aspect of the present invention, a method of fabricating a mask device includes: rolling a mask substrate; and forming an aperture region having a stripe pattern on the mask substrate such that the longitudinal direction of the stripe pattern is parallel to the roll direction of the mask substrate.

According to still another aspect of the present invention, a method of fabricating an OLED includes: forming a first electrode on a substrate; inserting the substrate having the first electrode into a deposition chamber that includes a mask device such that the longitudinal direction of the striped aperture region is parallel to the roll direction of the mask substrate; depositing an organic layer that includes an emission layer on the substrate; removing the substrate to the exterior of the deposition chamber; and forming a second electrode over the entire surface of the substrate.

Additional aspects and/or advantages of the invention will be set forth in part in the description which follows and, in part, will be obvious from the description or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1A:
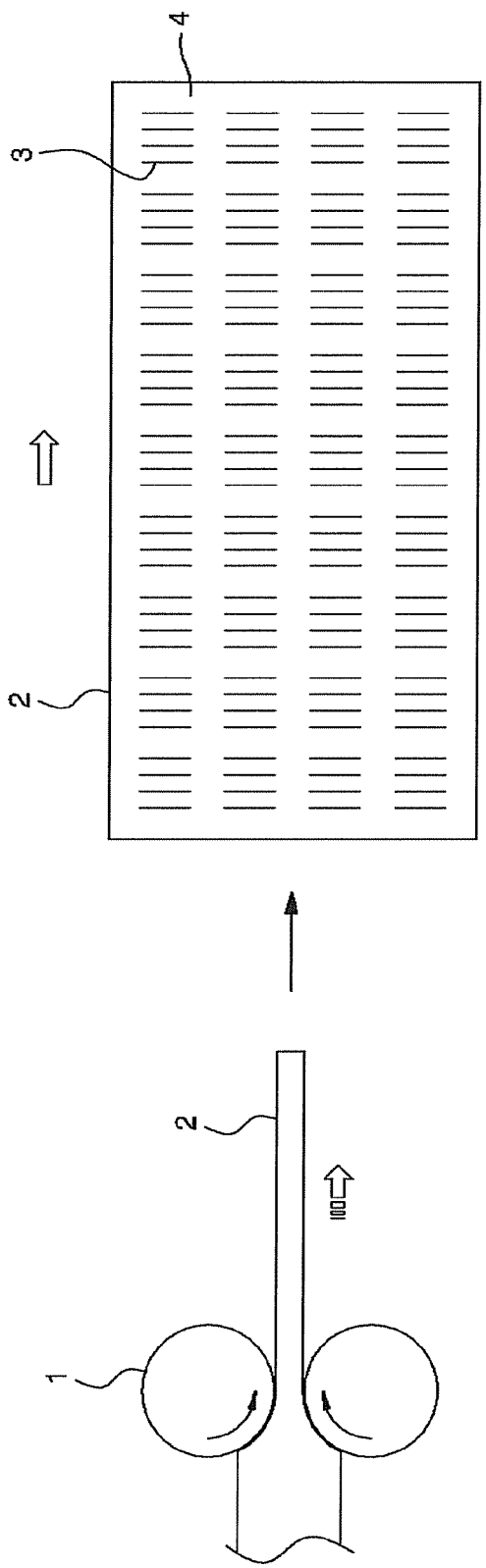
FIGS. 1A and 1B are plan views of a conventional mask device.
Figure 1B:
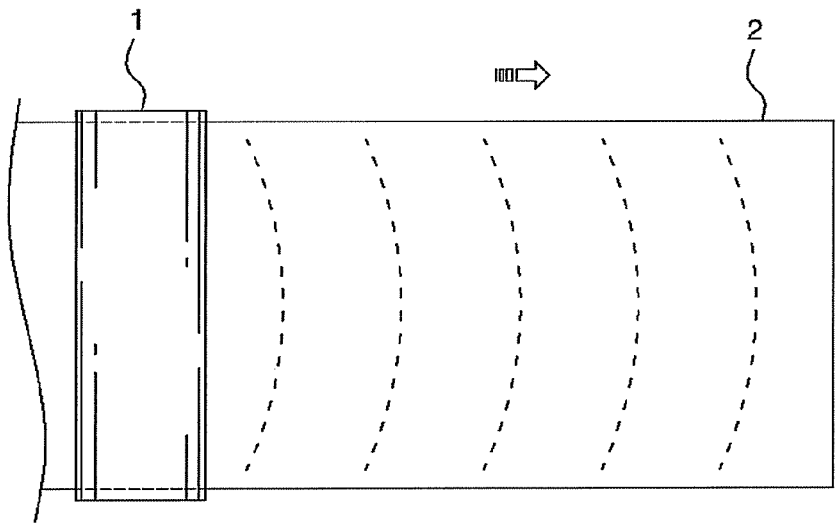

The present invention will now be described more fully hereinafter with reference to the accompanying drawings, in which example embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In addition, the thickness of layers and regions in the drawings may be exaggerated for clarity. Like reference numerals designate like elements throughout the specification.

FIGS. 2A to 2D are cross-sectional views of a mask device in accordance with an example embodiment of the present invention. First, referring to FIG. 2A, a steel plate formed of stainless steel, a metal or an alloy is prepared, and the steel plate is rolled by a roller 10 to form a mask substrate 11. As a result of the rolling process, the mask substrate has a thickness of 0.5-1 mm. Then, the mask substrate 11 passes through a pre-treatment process such as buff grinding, acid cleaning, water cleaning, and so on, in order to increase adhesion with a photoresist applied during the following process.

Figure 2A:
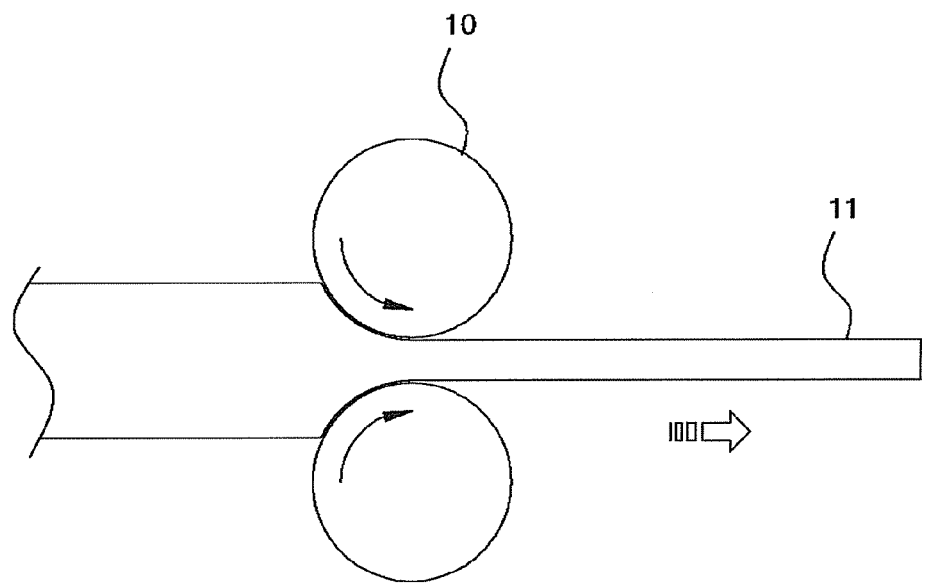
FIGS. 2A to 2D are cross-sectional views of a mask device in accordance with an example embodiment of the present invention.
Figure 2B:
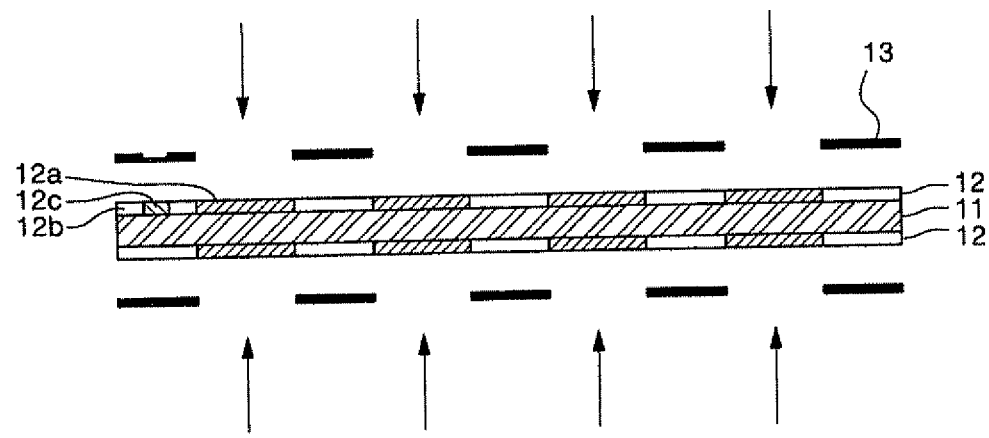

Referring to FIG. 2B, an aperture region, a blocking region, and a mask alignment mark are formed over the mask substrate 11 using a photolithography method. Specifically, a photoresist 12 is applied over the entire surface of the mask substrate 11. The photoresist 12 may use a positive photoresist for removing an exposed region, or a negative photoresist for removing an unexposed region. The example in FIG. 2B uses the positive photoresist.

After the photoresist 12 is applied on the entire surface of the mask substrate 11, a mask 13 is positioned on the mask substrate 11 and an exposure process is performed using a UV lamp. In this example, the photoresist 12 is divided into an exposure region 12a, an unexposed region 12b, and a semi-exposure region 12c. The exposure region 12a is varied in chemical and physical properties by UV light to be dissolved by a developing solution during the following development step.

Figure 2C:
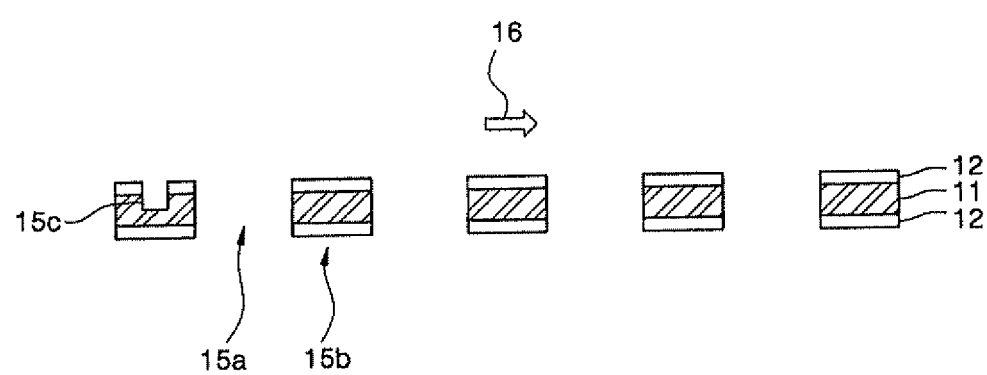

Referring to FIG. 2C, when the exposure process is completed, a development process is performed using a development solution to remove the photoresist of the exposure region 12a. Then, the mask substrate 11 is etched using an etching solution. That is, a region blocked by the photoresist of the unexposed region 12b of the mask substrate 11 is not etched, and the exposed region, in which the photoresist is removed, is etched to form an aperture region 15a and a blocking region 15b. In addition, the semi-exposure region 12c is etched to a certain depth to form a mask alignment mark 15c. In this example, the mask alignment mark 15c is formed outside the aperture region 15a. In order to reduce an alignment error when the mask is aligned to the substrate, at least one mark may be formed.

Figure 2D:
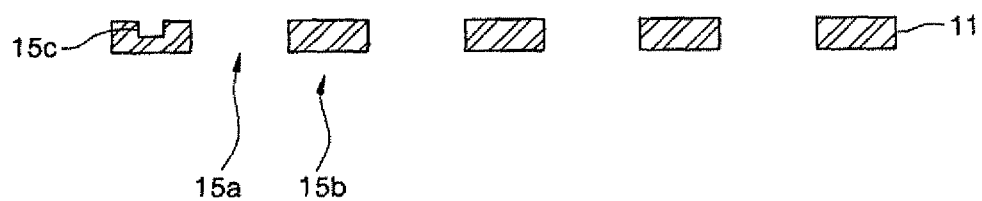

As shown in FIG. 2D, the photoresist 12 remaining on the mask substrate 11 is removed using a strip solution to complete the mask device in accordance with this example embodiment of the present invention.

Figure 3:
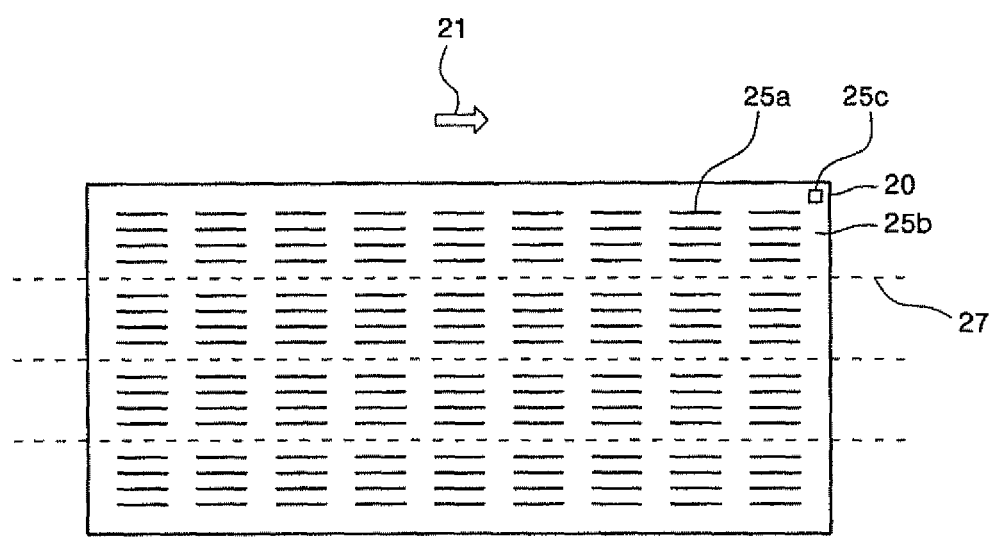
FIG. 3 is a plan view of the mask device in accordance with an example embodiment of the present invention.

FIG. 3 is a plan view of the mask device in accordance with this example embodiment of the present invention. Referring to FIG. 3, a mask device 20 fabricated by a method in accordance with this embodiment of the present invention has a striped aperture region 25a, a blocking region 25b, and a mask alignment mark 25c. More specifically, the rolled direction 21 of the mask substrate is parallel to the stripe direction of the aperture region 25a. Furthermore, the mask device 20 in accordance with this embodiment of the present invention can be divided along a scribing line 27 parallel to the roll direction of the mask 20 (i.e., the long side direction of the mask 20), to form division masks, thereby enabling the mask device 20 to be adapted to a large-sized substrate.

In the process disclosed in FIGS. 2A-2D and 3, the aperture region 15a of the mask substrate 11 has a stripe pattern. In this embodiment, the rolled direction 16 of the mask substrate 11 is parallel to the longitudinal direction of the stripe pattern of the aperture region 15a (see FIG. 3). The reason for this longitudinal orientation is to solve the problem disclosed above in which the conventional mask having the stripe direction of the aperture region perpendicular to the rolled direction is difficult to adapt to a large-sized substrate because of the limitations of a mask substrate. That is, in this embodiment, the rolled direction 16 of the mask substrate 11 is formed parallel to the longitudinal direction of the stripe pattern of the aperture region 15a to form the stripe of the aperture region 15a in a longitudinal direction of the mask substrate 11, thereby making it feasible to adapt the mask to a large-sized substrate.

Specifically, the rolled direction 16 is formed parallel to the stripe direction so that the margin between the stripe and the outer parts of the mask substrate can be widened. That is, in the conventional art, when the striped aperture region is narrowed, its error becomes larger because of the small length of the short side of the stripe. However, in this embodiment, since the side of the stripe along the margin is long, even though the aperture region of the stripe is narrowed, it is possible to enlarge the margin of the long side to readily pattern an emission layer.

In addition, it is possible to solve the problem disclosed above in which the conventional mask substrate has a variance in quality between the center area and outer areas because of the rolling process. That is, it is possible to solve the problem in which the striped aperture region is narrowed adjacent to the outer parts of the mask substrate, rather than formed in a straight (longitudinal) direction, because of the variance in quality between the center area and the outer areas of the mask substrate rolled to have a low quality of degree of straightness.

In evaluating this process, the degree of straightness can be measured. Degree of straightness means how the striped aperture region of the mask is positioned on a straight line. The degree of straightness can be numerically expressed by measuring how parallel a first stripe is to a second stripe. A small degree of straightness means that the first stripe and the second stripe are closely aligned in a straight line, and a large degree of straightness means that the first stripe and the second stripe are misaligned.

Figure 4:
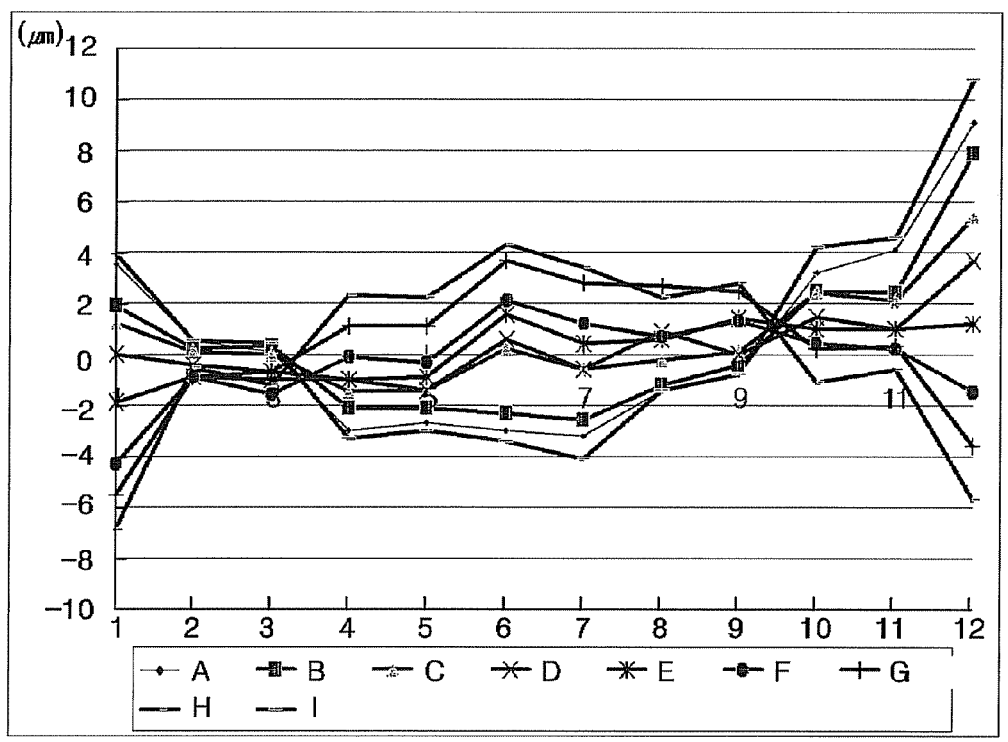
FIG. 4 is a graph showing degree of straightness of a conventional mask stripe.
Figure 5:
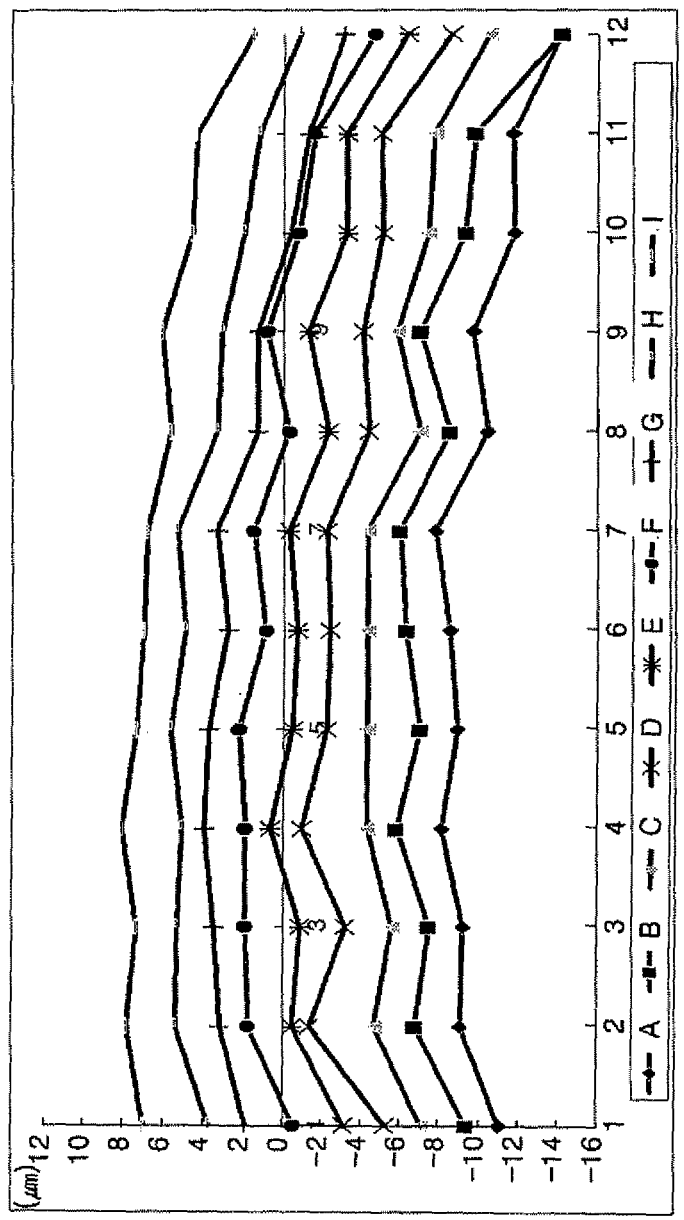
FIG. 5 is a graph showing degree of straightness of a mask stripe in accordance with an example embodiment of the present invention.

Referring to FIGS. 4 and 5, FIG. 4 is a graph showing degree of straightness of a conventional mask stripe, and FIG. 5 is a graph showing degree of straightness of a mask stripe in accordance with an example embodiment of the present invention. In these figures, the Y-axis represents vertical gaps between an end point of a reference stripe (positioned at "00") and end points of other stripes (for example A to I) disposed above and below the reference stripe, and the X-axis represents the number of end points of the stripes arranged in a horizontal direction.

Referring to FIG. 4, it will be appreciated that the conventional mask device having a stripe perpendicular to the roll direction shows a maximum degree of straightness error of 15 µm, i.e., a low quality degree of straightness. However, referring to FIG. 5 it will be appreciated that the mask device in accordance with this embodiment of the present invention has an improved degree of straightness of the stripes A to I of 6 μm or less.

As described above, when the mask substrate is rolled out, it is possible to improve the degree of straightness of the stripe of the mask by forming the stripe parallel to the roll direction. In addition, although the stripe of the aperture region 25a has a long side and the degree of straightness of the mask varies, it is possible to increase the margin of the aperture region 25a even though the striped aperture region recedes, thereby improving reliability of the mask.

Figure 6:
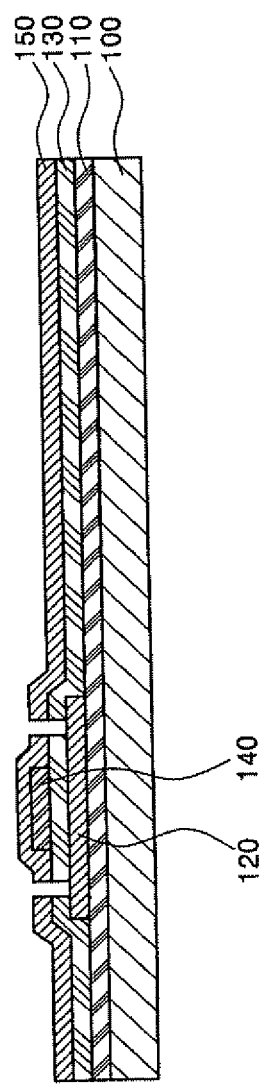
FIGS. 6, 7 and 9 are cross-sectional views of an OLED in accordance with an example embodiment of the present invention.
Figure 7:
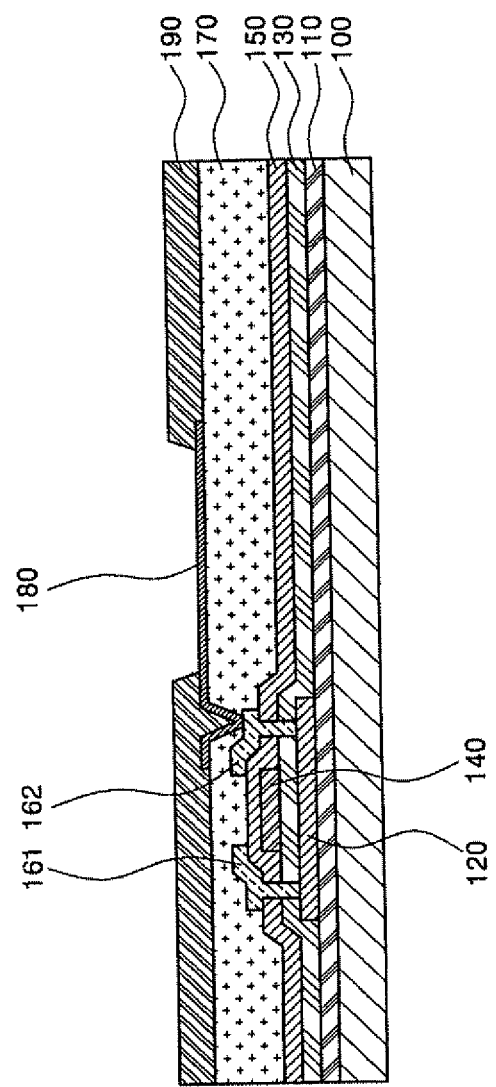
Figure 9:
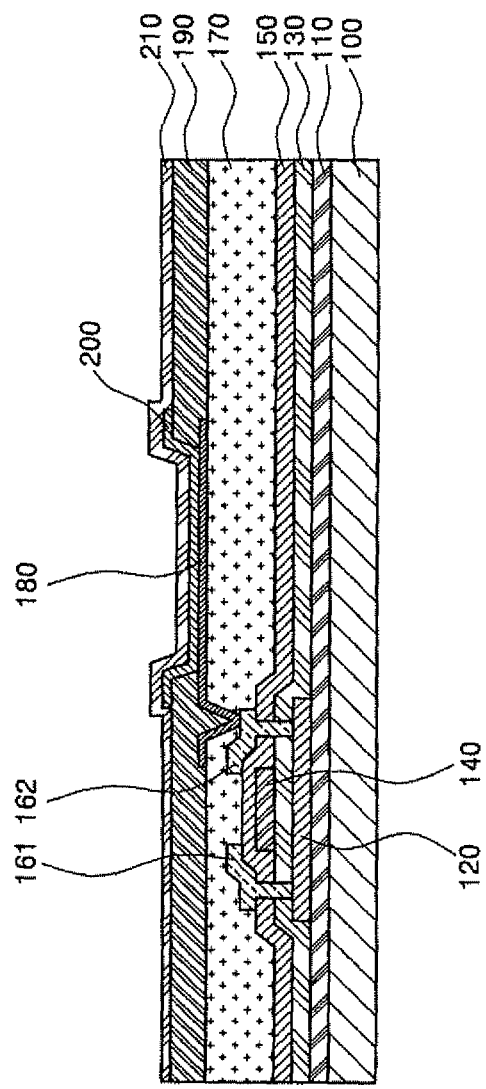

Hereinafter, a method of fabricating an OLED using the mask device in accordance with the present invention will be described. FIGS. 6, 7 and 9 are cross-sectional views of an OLED in accordance with an example embodiment of the present invention.

First, referring to FIG. 6, a buffer layer 110 is formed on a conductive or plastic substrate 100, and an amorphous silicon layer is formed on the buffer layer 110 and crystallized to form a polysilicon semiconductor layer 120.

A gate insulating layer 130 is formed over the entire surface of the substrate 100 including the semiconductor layer 120, and a gate electrode 140 corresponding to a specific region of the semiconductor layer 120 is formed on the gate insulating layer 130. Then, an interlayer insulating layer 150 is formed over the entire surface of the substrate 100 including the buffer layer 110, the semiconductor layer 120, the gate insulating layer 130 and the gate electrode 140, and the interlayer insulating layer 150 is etched to expose a second specific region of the semiconductor layer 120, thereby forming contact holes.

Referring to FIG. 7, source and drain materials are deposited on the entire surface of the substrate 100 and patterned to form source and drain electrodes 161 and 162 connected to the second specific region of the semiconductor layer 120, and a planarization layer 170 is formed over the entire surface of the substrate 100. Next, the planarization layer 170 is etched to form a via-hole exposing any one of the source and drain electrodes 161 and 162, and a first electrode 180 is formed on the planarization layer 170 to be connected to any one of the source and drain electrodes 161 and 162. Then, a pixel-defining layer 190 exposing the first electrode 180 is formed, and an organic layer 200 (see FIG. 9) is formed on the first electrode 180 and the pixel-defining layer 190.

Figure 8:
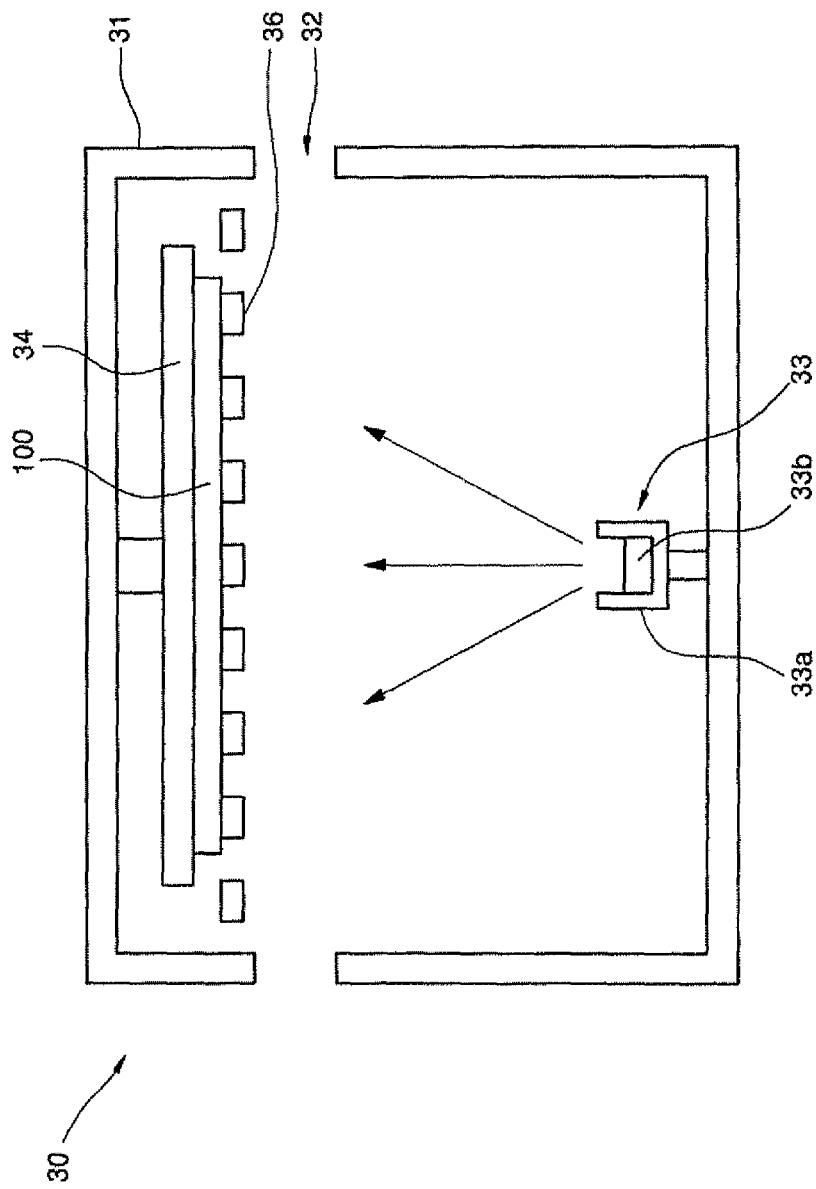
FIG. 8 is a schematic view showing the process of depositing an organic layer.

FIG. 8 is a schematic view showing a process of depositing an organic layer 200. Referring to FIG. 8, a deposition apparatus 30 includes a mask device 36 in accordance with an embodiment of the present invention. The deposition apparatus 30 includes a vacuum chamber 31 having a rectangular-box shape and formed of a steel use stainless (SUS) material to act as a main body, and an opening/closing port 32 installed at a side part of the vacuum chamber 31 and through which a substrate is conveyed.

An evaporation source 33 is installed at a lower part of the vacuum chamber 31. The evaporation source 33 includes a crucible 33a for containing an organic material 33b. A chuck 34 is installed at an upper part of the vacuum chamber 31, and a substrate 100 is supported by the chuck 34. The mask device 36 is attached to the substrate 100 to adjust the deposited shape of the organic material.

In this process, as described above, the mask device 36 includes an aperture region having a stripe direction parallel to the roll direction of the mask substrate fabricated in accordance with an example embodiment of the present invention and a degree of straightness of 6 μm or less. In addition, the mask device 36 may be formed of a metal or a metal alloy, preferably stainless steel.

The substrate 100 including the pixel-defining layer 190 (see FIG. 9) is inserted into the deposition apparatus 30, and the organic material 33b is evaporated by the evaporation source 33 to form an organic layer 200 (see FIG. 9) on the substrate 100. The organic layer 200 may be formed using an evaporation method.

Referring to FIG. 9, the deposited substrate 100 is discharged to the exterior of the deposition apparatus 30, and a second electrode 210 is deposited over the entire surface of the substrate 100 to complete an OLED in accordance with an example embodiment of the present invention.

As described above, since the mask device having the stripe direction parallel to the roll direction of the mask substrate includes the striped aperture region having a degree of straightness of 6 μm or less, i.e., a high degree of straightness, an emission layer pattern can be deposited at the desired position during the following organic material deposition process to improve reliability of the organic material deposition process.

As can be seen from the foregoing, a mask device, a method of fabricating the mask device with improved reliability, a method of manufacturing a large-sized division mask device by forming a striped aperture parallel to the roll direction, and a method of fabricating an OLED using the mask device are provided.

Although the present invention has been described with reference to certain example embodiments thereof, it will be understood by those skilled in the art that a variety of modifications and variations may be made to the present invention without departing from the spirit or scope of the present invention defined in the appended claims, and their equivalents.

What is claimed is:

1. A mask device comprising:
   at least one mask alignment mark on a mask;
   a blocking region on the mask for blocking deposited material; and
   an aperture region on the mask through which the deposited material passes,
   wherein the at least one mask alignment mark is outside the aperture region, the aperture region has a stripe pattern, the mask has a thickness of 0.5-1 mm, and a roll direction of a substrate on which the mask is formed is substantially parallel to a longitudinal direction of the stripe pattern to form the aperture region to have individual stripes in the stripe pattern each with a degree of straightness of 6 μm or less relative to a straight line; and
   wherein the roll direction of the substrate on which the mask is formed and the longitudinal direction of the stripe pattern are also substantially parallel to a longitudinal direction of at least one scribe line for dividing the mask.

2. The mask device according to claim 1, wherein the mask is formed of a metal or a metal alloy.

3. The mask device according to claim 2, wherein the mask is formed of stainless steel.

4. A method of fabricating a mask device, comprising:
   rolling a mask substrate;
   forming an aperture region having a stripe pattern on the mask substrate, wherein a longitudinal direction of the stripe pattern is substantially parallel to a roll direction of the mask substrate, such that the formed aperture region has individual stripes in the stripe pattern each with a degree of straightness of 6 μm or less relative to a straight line;
   forming at least one scribe line having a longitudinal direction substantially parallel to the roll direction of the mask substrate and the longitudinal direction of the stripe pattern for dividing the mask substrate; and forming at least one mask alignment mark on the mask substrate, wherein the mask substrate is formed to a thickness of 0.5-1 mm.

5. The method according to claim 4, wherein the mask substrate is formed by a roll process using a roller.

6. The method according to claim 4, wherein the aperture region is formed by a photolithography method.

7. The method according to claim 4, further comprising performing a pre-treatment process after rolling the mask substrate.

8. The method according to claim 4, wherein forming the aperture region further comprises:
 applying a photoresist over an entire surface of the mask substrate;
 positioning a mask over the mask substrate;
 exposing an open area corresponding to a combination of the mask and mask substrate with ultraviolet light;
 dissolving portions of the photoresist exposed to the ultraviolet light;
 etching portions of the mask substrate corresponding to the dissolved portions of the photoresist; and
 removing remaining portions of the photoresist with a strip solution.

9. The method according to claim 8, wherein the mask causes respective regions of the mask substrate to be fully exposed, to be unexposed, and to be semi-exposed, and wherein the semi-exposed region of the mask substrate is only partially etched.

10. The method according to claim 4, wherein forming the aperture region further comprises:
 applying a photoresist over an entire surface of the mask substrate;
 positioning a mask over the mask substrate;
 exposing an open area corresponding to a combination of the mask and mask substrate with ultraviolet light;
 dissolving portions of the photoresist unexposed to the ultraviolet light;
 etching portions of the mask substrate corresponding to the dissolved portions of the photoresist; and
 removing remaining portions of the photoresist with a strip solution.

11. The method according to claim 4, further comprising:
 dividing the mask device along the at least one scribe line.

* * * * *